United States Patent [19]

Hyatt

[11] 4,209,852

[45] Jun. 24, 1980

[54] SIGNAL PROCESSING AND MEMORY ARRANGEMENT

[76] Inventor: Gilbert P. Hyatt, P.O. Box 4584, Anaheim, Calif. 92803

[21] Appl. No.: 522,559

[22] Filed: Nov. 11, 1974

[51] Int. Cl.$^2$ .......................................... G11C 11/40
[52] U.S. Cl. .................................. 365/222; 365/45; 365/183; 307/221 C; 357/24
[58] Field of Search ..... 340/173 R, 173 CA, 173 RC; 307/221 C, 221 D; 357/24; 328/37; 365/222, 45, 183

[56] References Cited

U.S. PATENT DOCUMENTS

| | | | |
|---|---|---|---|
| 2,961,535 | 11/1960 | Lanning | 340/173 RC |
| 3,368,203 | 2/1968 | Loizdes | 340/173 RC |
| 3,643,106 | 2/1972 | Berwin | 340/173 R |
| 3,701,978 | 10/1972 | Miller | 340/173 R |
| 3,774,169 | 11/1973 | Smith | 340/173 Analog |
| 3,810,126 | 5/1977 | Butler | 365/45 |
| 3,868,516 | 2/1975 | Buss | 307/221 D |
| 3,876,989 | 4/1975 | Bankowski | 340/173 R |
| 3,889,245 | 6/1975 | Gosney | 340/173 R |
| 3,891,977 | 6/1975 | Amelio | 340/173 R |
| 3,909,806 | 9/1975 | Uchida | 340/173 R |
| 3,914,748 | 10/1975 | Barton | 340/173 R |
| 3,969,705 | 7/1976 | Waggener | 365/45 |
| 3,999,171 | 12/1976 | Parsons | 340/173 RC |

OTHER PUBLICATIONS

IBM Tech. Dis. Bul., "Regeneration Circuit for CLD Shift Register" R. H. Dennard, vol. 14, No. 12, May 1972, pp. 3791-3792.

Primary Examiner—Terrell W. Fears
Attorney, Agent, or Firm—Gilbert P. Hyatt

[57] ABSTRACT

An improved arrangement is provided for processing analog and digital signals, where particular advantages are obtained using charge coupled devices (CCDs). A memory arrangement utilizes a novel refresh circuit to re-establish signal amplitudes which are degraded by a CCD memory. Further, various gating and control circuits are used for loading and unloading the memory. A CCD signal processor and memory arrangement is provided for in an embodiment of an array processing system to exemplify one application of these arrangements.

40 Claims, 19 Drawing Figures

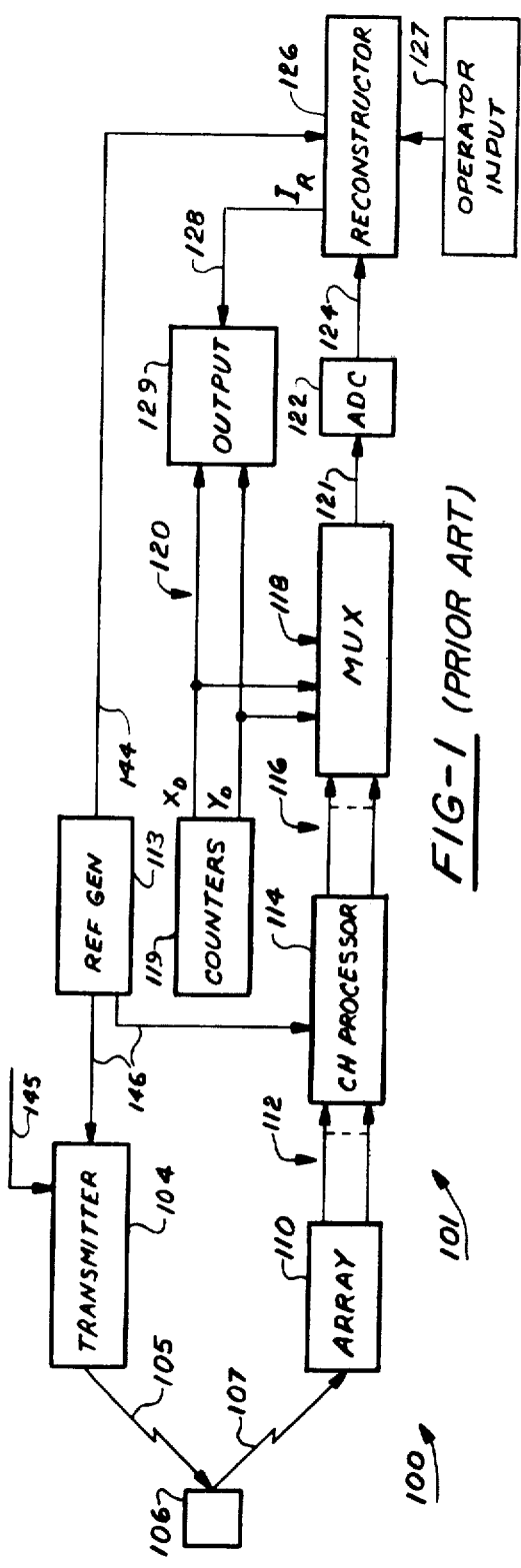
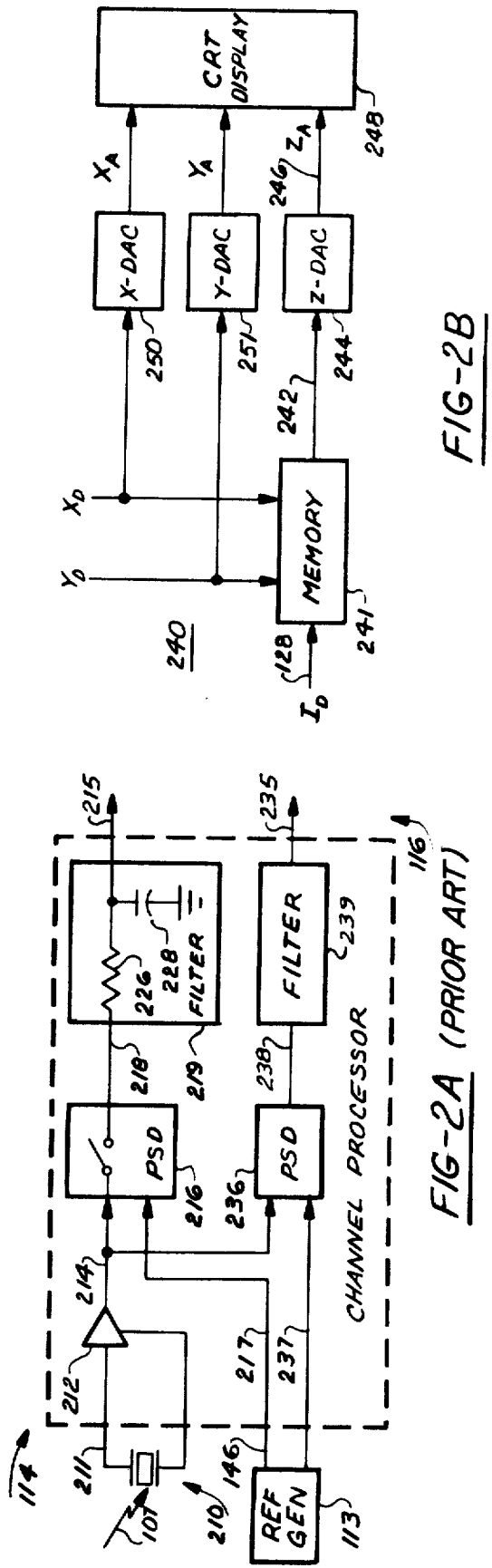

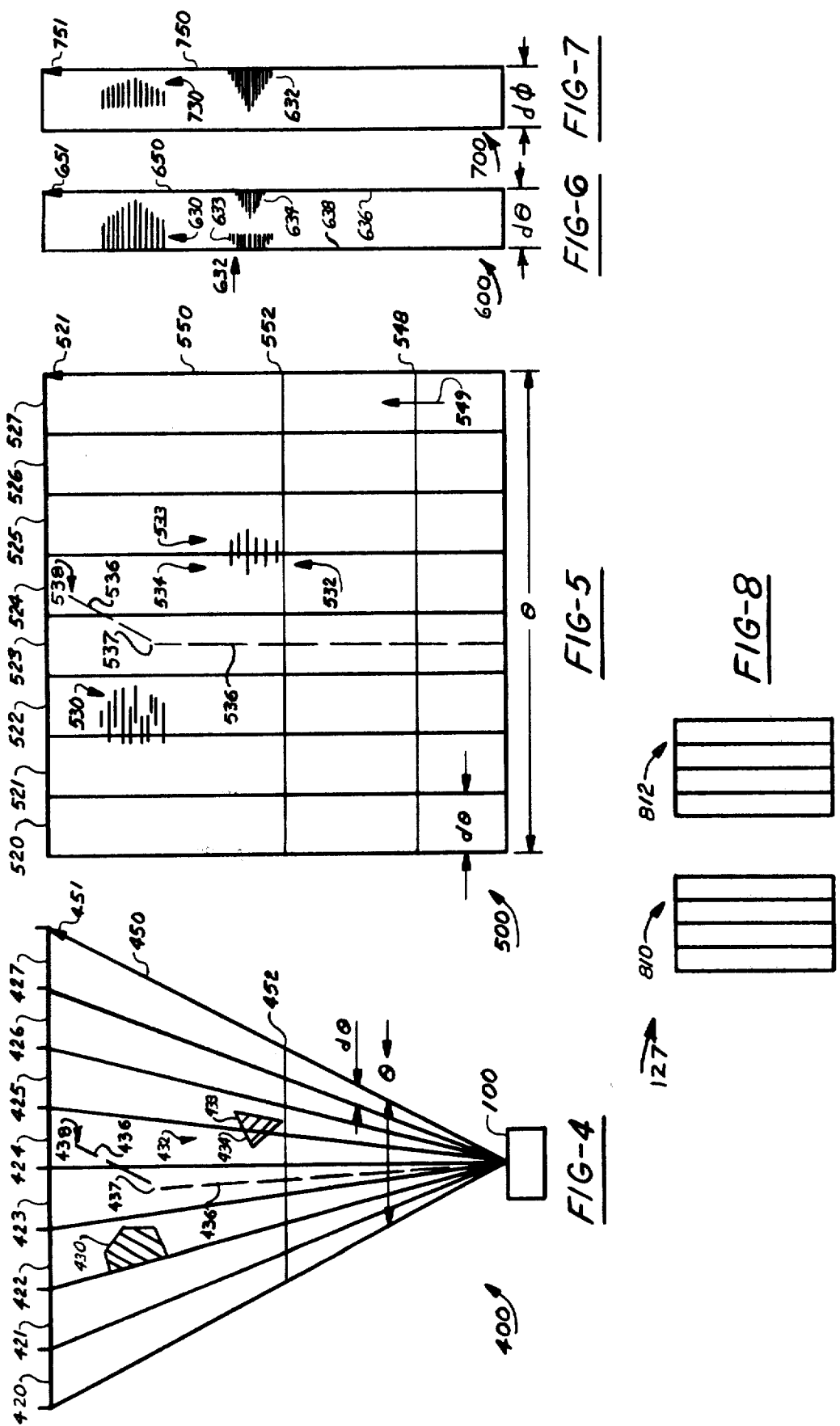

SIGNAL PROCESSING AND MEMORY ARRANGEMENT

CROSS REFERENCE TO RELATED APPLICATIONS

The instant application is related to applications Holographic System For Object Location and Identification Ser. No. 490,816 filed on July 22, 1974 by Gilbert P. Hyatt; Factored Data Processing System For Dedicated Applications Ser. No. 101,881 filed on Dec. 28, 1970 by Gilbert P. Hyatt; Control System and Method Ser. No. 134,958 filed on Apr. 19, 1971 by Gilbert P. Hyatt; and Control Apparatus Ser. No. 135,040 filed on Apr. 19, 1971 by Gilbert P. Hyatt; which applications are herein incorporated-by-reference.

BACKGROUND OF THE INVENTION

1. Field of the Invention

This invention relates to signal processing and memory arrangements and, in particular, CCD arrangements for array signal processing and array information storage.

2. Description of the Prior Art

Prior art CCD arrangements have been used to store and shift signals, wherein these signals are degraded by shifting through the CCD devices. Therefore, the amount of shifting has been severly limited, where analog signal degradation has limited use to digital memory devices. Also, array processing systems generally use complex electronic circuitry to receive multitudes of array input signals, pre-process these signals, and multiplex these signals into a conventional memory such as a core memory arrangement.

The signal processing and memory arrangement of the present invention has not been used in the prior art and certainly not in conjunction with array processing systems.

BRIEF DESCRIPTION OF THE INVENTION

The present invention provides signal processing and memory arrangements for processing digital, analog, and hybrid signals and for preserving signal precision. Arrangements are provided for sampling, demodulating, integrating, and multiplexing information using electronic devices such as charge couple devices (CCDs). Further, these arrangements may be used in conjunction with an array processing system to provide a high level of integration of circuitry.

A composite sampling, demodulating, filtering, and multiplexing arrangement is provided for multiple analog input signals such as from a transducer array. The signals are processed and loaded into an analog signal shiftable device to provide filtering and multiplexing operations.

The shifting of electronic signals may cause signal degradation. Therefore, a signal refresh arrangement is provided to automatically re-establish signal amplitudes. In one embodiment, a hybrid arrangement is used to process signals in both the analog and digital domains to re-establish signal amplitudes. In another embodiment, an adaptive control arrangement is provided wherein a reference signal is stored with the data signals and the amount of amplitude adjustment is performed adaptively as a function of reference signal degradation. Therefore, signal amplitudes may be re-established based upon actual degradation and may be continually adjusted for variations in circuits, environments, and other considerations.

In accordance with one feature of the present invention, an improved charge couple device signal processing arrangement is provided.

A further feature of the present invention provides a hybrid memory arrangement.

A still further feature of the present invention provides improved signal refresh capability.

Yet a further feature of the present invention provides an adaptive refresh capability.

In accordance with yet another feature of the present invention, an improved array signal processing arrangement is provided.

The foregoing and other objects, features, and advantages of this invention will become apparent from the following detailed description of preferred embodiments of this invention as illustrated in the accompanying drawings.

BRIEF DESCRIPTION OF THE DRAWINGS

A better understanding of the invention may be had from a consideration of the detailed description hereinafter taken in conjunction with the drawings which are described below.

FIG. 1 is a block diagram of an acoustic imaging system in accordance with the present invention.

FIG. 2 comprising FIGS. 2A and 2B provides detailed representation of blocks shown in FIG. 1; wherein FIG. 2A shows a detailed embodiment of a channel processor and FIG. 2B shows a detailed embodiment of a CRT display output.

FIG. 4 illustrates the geometry of an environment interrogated by the system of the present invention.

FIG. 5 illustrates a low resolution and wide field-of-view display arrangement.

FIG. 6 illustrates a high resolution and narrow field-of-view display arrangement.

FIG. 7 illustrates an intermediate resolution and intermediate field-of-view display arrangement.

FIG. 8 illustrates operator control arrangements in accordance with the present invention.

FIG. 9 comprising FIGS. 9A–9E illustrates signal processing arrangements using charge couple devices (CCDs) in accordance with the present invention; wherein FIG. 9A illustrates a CCD channel processor arrangement, FIG. 9B illustrates a CCD beam forming arrangement, FIG. 9C illustrates a CCD hybrid memory arrangement, FIG. 9D illustrates signal degradation and compensation in accordance with the hybrid memory arrangement of the present invention, FIG. 9E illustrates an alternate embodiment of a CCD memory arrangement.

Figure 3:
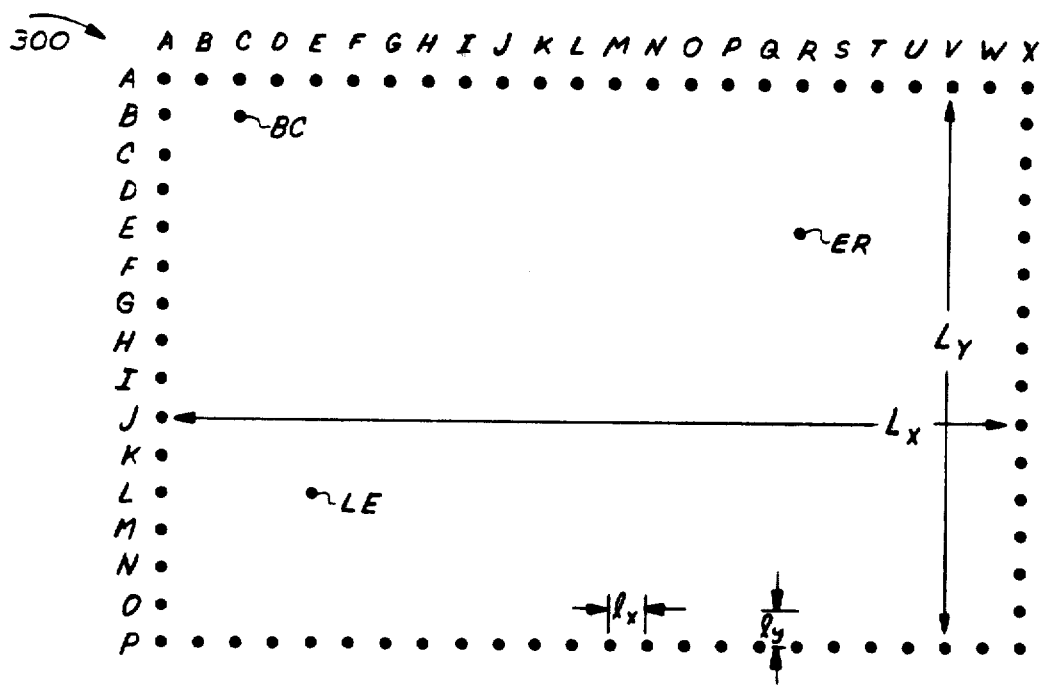
FIG. 3 illustrates array geometry in accordance with the present invention.

By way of introduction of the illustrated embodiment, the components shown in FIGS. 1-9 of the drawings have been assigned general reference numerals and a brief description of each such component is given in the following description. The components in each figure have in general been assigned three digit reference numerals wherein the hundreds digit of the reference numeral is related to the figure number; where the components in FIG. 1 have reference numerals between 100 and 199 and the components in FIG. 2 have reference numerals between 200 and 299 except that the same component appearing in successive drawing figures has maintained the first reference numeral.

DETAILED DESCRIPTION OF THE INVENTION

The processing system of the present invention can take any of a number of possible forms. Preferred embodiments of several forms of the present invention are shown in the accompanying figures and will be described in detail hereafter.

The memory arrangement of the elected invention is described in the context of an acoustical holography system to exemplify the systems-related implications of such a memory arrangement. The acoustical holography system of the preferred embodiment is shown in detail in FIGS. 1-8 herein and is described in detail in related application Ser. No. 490,816 at page 8 line 7 to page 46 line 28 therein; which description was part of the instant application as-filed; and which description is herein incorporated-by-reference from said related application Ser. No. 490,816 as if fully set forth at length herein. The relationship of the material incorporated-by-reference and the instant disclosure is implicit in the correspondence of said material and the figures of the instant application. Further, the files of said application Ser. No. 490,816 are hereby opened to the public for the limited purpose of obtaining copies of the specification as-filed and the amendments to the specification as required to facilitate the incorporation-by-reference, but not for the purpose of obtaining copies of the claims, the prosecution arguments, or other papers or portions of papers that are not required to facilitate the incorporation-by-reference.

CHARGE COUPLE DEVICE SIGNAL PROCESSOR

Charged couple devices (CCDs) may be used to provide signal processing in accordance with the present invention. CCDs are well known in the art, being monolithic integrated circuits having charge storage and charge transfer capability. The CCD may have one or more input terminals, one or more output terminals, and a plurality of charge transfer stages to "shift" the charge between stages. Arrangement of input stages, output stages, and transfer circuits are well known in the art. For simplicity of discussion, a CCD will be considered as a circuit having input signal lines, output signal lines, and various shiftable stages coupling input and output lines. The monolithic implementation of such a CCD is well known in the art and therefore will not be discussed herein.

CCD signal processors will be discussed with reference to FIG. 9 hereinafter in the embodiment of an acoustic imaging system. These CCD signal processor arrangements are intended to be generally applicable for many signal processing uses that will become obvious to those skilled in the art from the teachings of the present invention. For example, this CCD signal processor arrangement may be used as a demodulator, multiplexer, or sample-and-hold circuit for use in systems including data acquisition, analog signal processing, computer peripheral, telemetry, and other systems. Further, a hybrid memory embodiment may be used as an off-line computer memory, an on-line computer memory, a disk memory replacement, an analog memory for an analog or hybrid computer, and other arrangements.

CCD DEMODULATOR AND MULTIPLEXER

In accordance with the present invention, a phase sensitive demodulator and a multiplexer arrangement will now be described with reference to FIG. 9A. To exemplify this embodiment of the present invention, it will be described relative to the channel processing arrangement for an acoustic imaging system.

An array of transducer elements 910 is provided to generate transducer signals 912 with each element 911 generating an output signal 913 in response to acoustic inputs sensed by elements 910. Signal processors 914 provide signal processing operations on signals 912, where these signal processing operations may include buffering, amplification, and noise filtering. Processed transducer signals 915 and 916 may each be input to one switch or a pair of switches shown as field effect transistor (FET) switches 917 and 918. One of each pair of switches may be controlled by an in-phase (0°) reference signal 930 and the other switch may be controlled by a quadrature (90°) reference signal 931. Reference generator 929 generates in-phase signal 930 and quadrature signal 931 for complex demodulation of processed signals 915. In one embodiment, reference generator 929 may have substantially the same frequency as the acoustic signals sensed by elements 910. As is well known in the art, sampling or switching an AC signal with a reference signal will provide an output signal that is related to the component of the input signal that is in-phase with the reference signal. Therefore, in-phase reference signal 930 controls in-phase FET 917 to provide in-phase demodulated signals and quadrature reference signal 931 controls quadrature FETs 918 to provide quadrature demodulated signals. CCD 920 is implemented to receive and store a plurality of demodulated input signals 919 with corresponding charge storage and shift elements, where each storage element in CCD 920 sums or integrates the charge provided by each corresponding signal 919 which are switched or demodulated with FETs 917 and 918. The amount of charge that is accumulated in each CCD storage element is related to the amplitude of the input signal and the time that switches 917 and 918 are conducting. The summation of samples controlled with FETs 917 and 918 cause a charge to be stored that has a magnitude related to the phase related components of the input signal 915 which is sampled in-phase with the corresponding reference signal 930 or 931.

Mode logic 921 controls system operations. A plurality of modes may be provided with control signals including demodulate and integrate mode signals 924, shift signal 922 and convert signal 923. These signals control the sequential modes of operation of the system. For example, demodulate and integrate signal 924 enables reference generator 929 to generate in-phase signal 930 and quadrature signal 931 to sample input signals 915 with switches 917 and 918 to build-up charge in corresponding elements of CCD 920, which demodulates and filters processed signals 915. After a predetermined period of time or quantity of integration samples, the shift and convert mode may be enabled, and the demodulate and integrate mode may be disabled; thereby causing signals 930 and 931 to turn off or "open" switches 917 and 918 to prevent further charge accumulation in CCD 920. Mode logic 921 may then generate clock pulses 922 to shift the stored charge through CCD 920 to output signal line 925. Analog-to-digital converter (ADC) 926 may be controlled with convert signal 923 to convert analog output signal 925 to digital form as digital signals 927. Clock signal 922 and convert signal 923 may be interleaved so that each analog signal 925 that is shifted out of CCD 920 will be converted with ADC 926 to provide sequential digital output signals 927. Therefore, it can be seen that the plurality of demodulated and integrated signals may be stored in CCD 920 and may be sequentially or serially shifted out of CCD 920 as analog output signals 925 and may be converted to sequential digital signals 927 with ADC 926. This arrangement provides a parallel-to-serial signal converter, which is known in the art as a multiplexer.

Mode logic 921 may be a well known counter and decoder arrangement such as a Texas Instruments counter Ser. No. 7490 and decoder 7442. Gating of clock signals and generation of quadrature signals is discussed in copending patent applications which are incorporated herein by reference.

The arrangement described with reference to FIG. 9A further exemplifies a CCD arrangement for summing analog signals. Input signals 919 excite related CCD elements when switches 917 and 918 are conducting, where the CCD elements effectively add new charge that is related to the amplitude of input signal 919 to the charge previously stored in the corresponding CCD element.

Prior art phase sensitive demodulators provide a switching arrangement and a filtering arrangement, wherein the filtering arrangement "smooths" switching transitions to provide a steady state output signal. In system 900, switches 917 and 918 in conjunction with CCD 920 provide operations similar to that used in prior art phase sensitive demodulators. For example, switches 917 and 918 will switch processed signals 915 in-phase with reference signals 930 and 931 and charge storage elements of CCD 920 will integrate or filter the sampled processed signals 919 to provide a steady state charge signal proportional to the phase related component of processed signals 919 as a steady state charge amplitude without switching transients.

The CCD demodulator and multiplexer embodiment has been described for a combined phase sensitive demodulator and multiplexer arrangement. It is herein intended that the demodulator arrangement and the multiplexer arrangement may be usable as separate arrangements and may be combined in a preferred embodiment of the present invention. Further, any reference to a demodulator with reference to the embodiment shown in FIG. 9A is also intended to exemplify a sample-and-hold arrangement wherein the demodulator arrangement described with reference to FIG. 9A provides a sample and storage operation under control of mode signals and therefore further exemplifies a sample-and-hold arrangement. Still further, a plurality of samples may be added or integrated under control of the reference signals 930 and 931 using the storage and charge adding or charge integrating capabilities of the CCDs, exemplifying analog summation or integration and particularly analog summation or integration under control of digital logic signals.

Figure 9A:
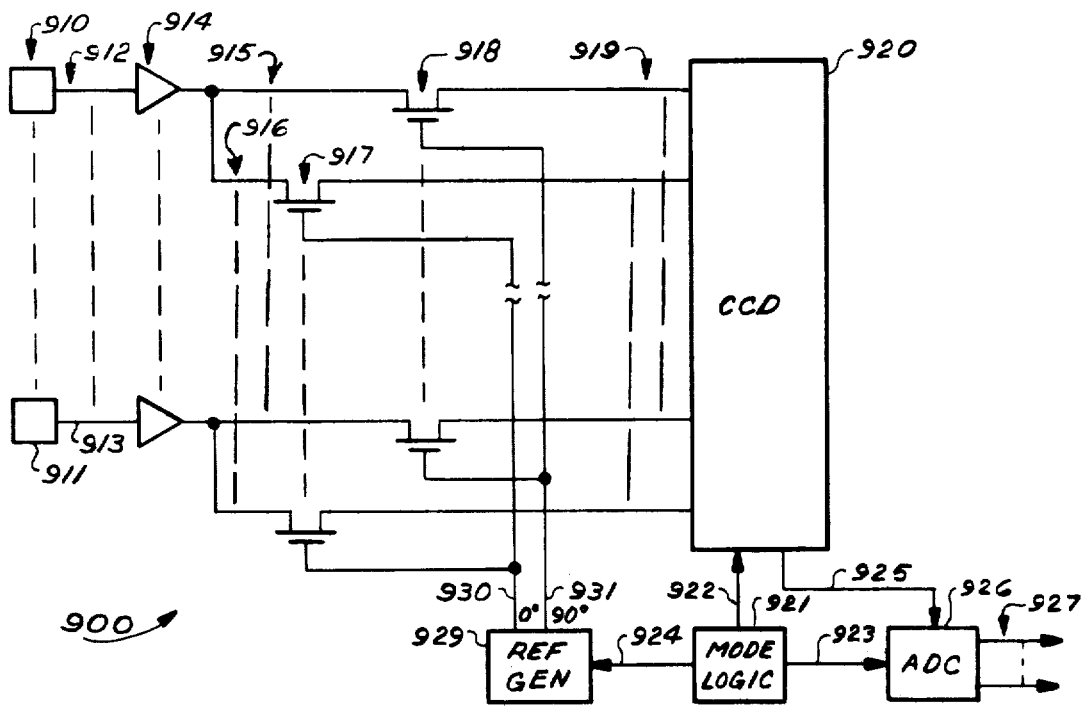
Figure 9B:
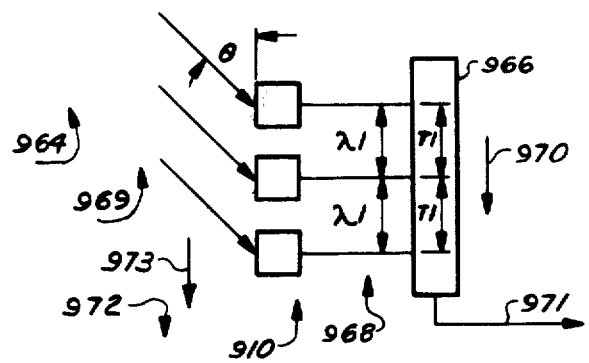

The elements shown in FIG. 9A may correspond to the elements shown in FIGS. 1, 2A, and 2B wherein transducer array 910 and transducer elements 911 shown in FIG. 9A may correspond to array 100 and elements 210 shown in FIGS. 1 and 2A, array output signals 912 and transducer signals 913 may correspond to signals 112 and 211 respectively as shown in FIGS. 1 and 2A, signal processor 914 and processed signals 915 and 916 may correspond to amplifier 212 and signal 214 as shown in FIG. 2A, switches 917 and 918 may correspond to PSDs 216 and 236 as shown in FIG. 2A, CCD 920 may correspond to filters 219 and 239 and multiplexer 118 as shown in FIGS. 1 and 2A, CCD output signal 925 may correspond to multiplexer output signal 121 as shown in FIG. 1, and ADC 926 and ADC output signals 927 may correspond to ADC 122 and signals 124 as shown in FIG. 1.

BEAM FORMING

A beam forming arrangement may be provided with a plurality of transducer elements for receiving incident illumination and a delay line having taps for introducing received energy from the transducers into the delay line. Assuming that the taps are equally spaced relative to the time delay therebetween, if the period of a signal introduced into the plurality of taps is equal to the time delay between taps, that signal will be reinforced at each tap and will exit the delay line having an amplitude related to the incident energy. If the period of the signal is different from the time delay between taps, the signal will not be reinforced to the same degree as in the above-mentioned case. Still further, if the waveform period is half the delay between taps, alternate taps would provide a signal 180 degrees out-of-phase with the preceding tap signal thereby cancelling the signal introduced at two adjacent taps. This is analogous to the operation of a well known phase sensitive demodulator wherein an input signal has a first frequency characteristic and wherein the reference signal has a frequency characteristic that is equal to the input signal frequency, different from the input signal frequency, or half of the input signal frequency respectively relative to the three delay line examples discussed above.

In one beam forming embodiment, a plurality of transducers 910 are shown receiving illumination along lines 969 from source 964. Transducer output signals 968 are connected to taps on CCD delay line 966. The input signals 968 propagate along CCD delay line 966 in the direction shown by arrow 970 to be generated as output signal 971, which is related to the time varying summation of input signals 968 having time delays T1 on input lines 968. If the time delay between signal taps 968 is a fixed delay T1 corresponding to a wave length λ1 and if the spacing between transducers 910 is related to wave-length λ1, then the delay line 966 will enhance the signals by summing the input components in-phase and outputting the time varying summation on signal line 971. If the incident illumination 969 has a frequency f1 with a wavelength λ1, then energy coming from source 964 propagating in direction 973 parallel to the plane of transducers 910 will provide in-phase signal components at each of the transducers 910 for enhancement of signal 971. For frequencies lower than frequency f1, an angle θ may exist wherein the incident illumination projected upon transducer array 910 will have a wavelength component equal to λ1 and thereby satisfying the conditions for enhancement of output signal 971. Therefore, it can be seen that there is a relationship between the spacing λ1 of transducer elements 910, time delay T1 between delay line taps 968 frequency of incident illumination, and angle-of-incidence θ for signal enhancement.

In accordance with one feature of the present invention, a beam forming arrangement is provided having a controllable illuminating frequency which defines the angle θ viewed by the array 910. A variable transmitter frequency has been discussed above with reference to FIG. 1 for reference frequency generator 113 and transmitter 104 and may be used with the beam forming arrangement of this inventive feature. It can be seen that the signal that will be enhanced with delay line 966 is a function of the frequency of the illumination and the angle θ of the incident illumination, wherein the component of wavelength in the plane of sensors 910 must be equal to distance λ1. Therefore, the lower the frequency the greater must be the angle θ and the higher the frequency the smaller must be the angle θ for enhancing signal 971. Further, signal 971 is related to the illuminated environment at an angle θ that is determined by the frequency of the incident illumination. Therefore, it can be seen that the direction of received beam θ is related to the frequency of the illumination, wherein the beam direction can be controlled by the illuminating frequency.

In accordance with the present invention, a variable frequency illuminator is provided to control the direction of the received beam 969 and therefore the portion of the environment to be interrogated, where the information is output as signal 971. Various well known arrangements may be used in conjunction with the system of the present invention including arrangements for controlling the transmitting frequency to sweep through a controllable angle θ to interrogate an environment.

In another embodiment of the present beam forming inventive feature, delay line 966 may be replaced with a CCD, as described above with reference to FIG. 9A. In this embodiment, CCD 920 receives input signals 919 from transducers 910. A clock generator 921 provides clock signals 922 to shift information along CCD 920 to the output signal 925. In this arrangement, it can be seen that the time delay between taps 919 is controlled by the frequency of clock 922, where the time delay is related to the clock frequency and to the number of shift stages between taps 919. For simplicity, it will herein be assumed that taps 919 are located one shift stage apart, wherein each clock pulse 922 will shift the charge that is accumulated at a particular tap 919 by one tap toward output signal 925.

CCDs have the characteristic of accumulating charge in relation to (1) the signal magnitude on an input line and (2) the time for which the signal is present. Therefore, the output signal on line 925 is related to the magnitude of signals 919 and the time of charge accumulation related thereto. Assuming that the time of charge accumulation is related to the shift frequency, the output signal 925 will be related to the signal magnitude on lines 919 for the time of charge accumulation. As discussed relative to FIG. 9B for the delay line 966, the output signal 925 will be related to the frequency of the illuminating energy, the time delay between shifting stored signals between input lines 919 and the angle of incidence θ of the illumination. Assuming that the frequency is constant and the time delay between input signal lines 919 is the frequency of shift clock signal 922, then beam angle θ that will cause signal 925 to be enhanced is inversely related to the frequency of clock signal 922, wherein a high clock frequency will steer the beam to a low angle and a low clock frequency will steer the beam to a high angle for enhancement of signals 925 and 971 related to the particular beam angle.

Therefore, beam forming may be achieved with a CCD arrangement and beam angle θ may be controlled by the frequency of clock signal 922.

The CCD arrangement set forth in FIG. 9A has been used to exemplify the CCD arrangement of the beam forming inventive feature. In this embodiment, switches 917 and 918 may be used for demodulating the input signals 916 or may be controlled to be conductive or "on" to provide greater similarity to the delay line embodiment discussed with reference to FIG. 9B. Further, the modes of integrate or shift as discussed for the demodulator and multiplexer arrangement with reference to FIG. 9A are interleaved as alternate integrate (sample) and shift commands for the beam forming feature of the present invention; wherein mode logic 921 may command integrate, shift, integrate, shift, etc. as alternate operations or interleaved operations for beam forming of input signals.

Background on beam forming concepts may be obtained from the prior art literature such as reference no. 13 by Dolph listed hereinafter and the references cited therein.

HYBRID MEMORY

Memories for storing digital information in digital form are well known in the art and include digital shaft registers, disk memories, and magnetic tape. In one embodiment of the present invention, a "digital" memory is provided for storing information in analog signal form and for operating in conjunction with a digital system as a digital memory. The storage of information in analog signal or multi-level signal form and the conversion between digital and analog signals for storage, for input, or for output will herein be termed a hybrid memory arrangement.

A CCD memory degrades signals as they are shifted through the memory due to charge transfer inefficiencies, thermally generated bias affects, and other well known affects. Several CCD memory refresh mechanizations will be described with reference to FIGS. 9A-9J to illustrate refresh embodiments. Refreshing may be provided in the digital domain as will be described with reference to FIG. 9C, in the analog domain as will be described with reference to FIGS. 9F and 9G, or in the hybrid (analog and digital) domain as will be discussed with reference to FIG. 9J. A digital refresh embodiment provides re-establishment of signal amplitudes with digital circuit elements substantially operating on digital signals in the digital domain. An analog refresh embodiment provides re-establishment of signal amplitudes with analog circuit elements substantially operating on analog signals in the analog domain. A hybrid refresh embodiment provides re-establishment of signal amplitudes with a combination of analog and digital circuit elements operating on analog signals and digital signals in combined analog and digital domains. A digital refresh embodiment is discussed with reference to FIG. 9C; where digital circuits add a digital "non-significant" bit to a digital signal to re-establish digital signal amplitude. An analog refresh embodiment is discussed with reference to FIGS. 9H and 9I; where analog circuits control gain with an analog sampled signal to re-establish analog signal amplitude. A hybrid refresh embodiment is discussed with reference to FIG. 9J where digital circuits set the gain of an analog amplifier with a digital gain setting number to control an analog signal.

The hybrid memory feature of the present invention will now be described. This feature provides improved storage utilization. For example, analog signals may be stored and shifted within CCD memory 932 to an accuracy that, for this example, will be assumed to be better than one part or one level in 256 levels or 8-bits of digital resolution. An analog signal having such resolution may require only a single shiftable memory cell. Digital signals stored and shiftable in CCD memory 932 having such digital resolution would reqire 8-bits of digital resolution to provide a resolution of one part in 256. Therefore, for this example an improvement in storage capacity by a factor of eight may be achieved, where 8-bit resolution analog information may be stored and shifted in CCD memory 932 requiring only one-eighth of the number of storage elements that would be required to store and shift 8-bit resolution digital information in CCD memory 932.

Figure 9C:
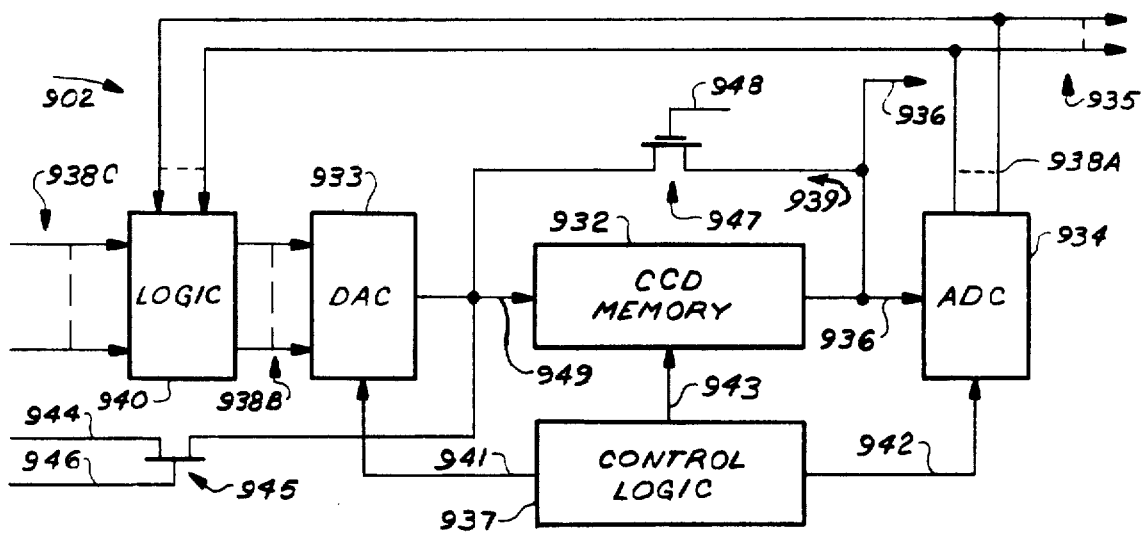

A hybrid memory arrangement using a CCD will now be described with reference to FIGS. 9C and 9D. Hybrid memory system 902 comprises CCD memory 932, input digital-to-analog converter (DAC) 933 and output analog-to-digital converter (ADC) 934. CCD memory 932 comprises a plurality of shiftable analog storage elements, wherein an analog input signal 949 is stored in a first CCD element and, under control of clock signal 943, input analog signal 949 is shifted through a plurality of CCD analog charge memory stages until it reaches an output stage which provides the shifted analog charge signal as output signal 936. Output analog signal 936 may be converted with ADC 934 to provide digital output signals 935 for use by a digital data processing system. Input digital signals 938B to DAC 933 are converted to analog signal 949 for storage in CCD memory 932. Information shifted out of CCD memory 932 may be recirculated as input information in analog signal form along recirculation path 939 or may be recirculated as digital signals from 938A to signals 938B. Information in CCD memory 932 may be changed by opening the recirculation path, either analog recirculation path 939 with switch 947 or digital recirculation path 938B with logic 940, and enabling digital input signals 938C with well known selection logic 940 or analog input signal 944 with switch 945.

Control logic 937 provides sequential control signals for clocking CCD memory 932 with clock signal 943 and for controlling the conversion of input and output information with convert signals 941 and 942. In one embodiment having digital recirculation, control logic 937 may provide clock signal 943 to provide a new output signal 936, then provide convert signals 941 and 942 to convert analog output signal 936 to digital signal 938A with ADC 934 and to convert digital signals 938B to analog signal 949. Signal 938A will be available to the digital system and will be further available for recirculation.

Operation and error reduction for a hybrid memory will now be discussed. An example will be provided to illustrate the relationships between signal degradation by a CCD memory and resolution of DAC 933 and ADC 934. In a preferred embodiment, ADC resolution is worse than DAC resolution which is worse than signal degradation through the CCD; where DAC and ADC resolution can be set to be worse than signal degradation. ADC 934 is assumed to have conversion precision of 8-bits or one part in 256 for the present example, where this resolution is assumed to be greater than the degradation of the stored information in CCD memory 932. Further, DAC 933 is assumed to have a resolution greater than the resolution of ADC 934, which will be 9-bits or one part in 512 for the present example. Therefore, it can be seen that DAC 933 may have greater resolution than ADC 934, where the state of the least significant bit of DAC 933 may be considered to have no "significance" and therefore may be set to either the one or the zero state without affecting the operation of hybrid memory 902. Therefore, in accordance with the present invention, the least significant bit of DAC 933, which is a "non-significant bit", will be set to the one state so that input analog signal 949 will always be on the high side of the permissible input signal variation, where any signal degradation through CCD memory 932 will merely be degradation of a part of the "non-significant" information or degradation of information that is always on the high side of the permissible variations within the resolution of ADC 934. Further, it can be seen that although analog signal 949 is degraded as it is shifted through CCD memory 932, the degradation will be less than the "non-significant" bit or "bias" imposed on signal 949 by DAC 933. This bias does not overlap to the next count of ADC 934 because it is also less than the resolution of ADC 934. Therefore, degradation of analog signal 949 through CCD memory 932 will always be less than the bias signal due to this "non-significant" bias bit in DAC 933 and therefore can never be degraded to the next lower count associated with ADC 934. Therefore, DAC 933 will re-establish the level of signal 949 independent of degradation through CCD memory 932, but neither re-establishment of the level with DAC 933 nor degradation of the signal shifted through CCD memory 932 will overlap the next highest count or degrade below the next lower count of ADC 934.

Figure 9D:
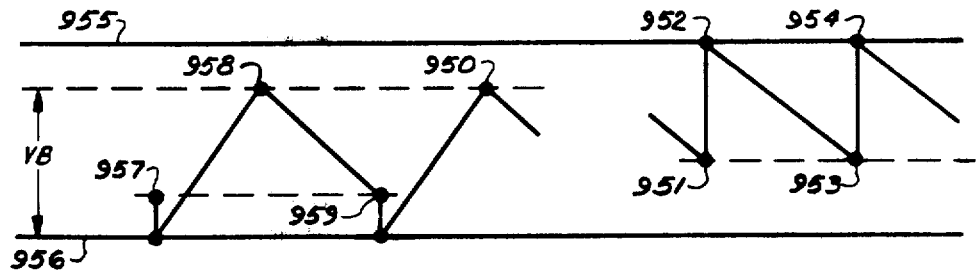

The error reduction concept can be better understood with reference to FIG. 9D, where a resolution increment or level of ADC 934 is shown bracketed by upper limit 955 and lower limit 956. Analog output signal 936 is shown having an amplitude 957 into ADC 934. ADC 934 converts signal 957 and rounds-off the output digital number to amplitude 956. The digital number related to amplitude or level 956 is recirculated as signals 938A and 938B to DAC 933 which converts amplitude 956 to an analog signal level and introduces an "non-significant" bit or bias having an amplitude VB which is less than the resolution increment between resolution amplitudes 956 and 955 but which is greater than the degradation of the signal 949 when shifted through CCD memory 932. Therefore, input signal 949 will have an amplitude that is equal to amplitude 956 plus the bias amplitude VB for a total amplitude shown as amplitude 958. As the analog input signal 949 is shited through memory 932, it is degraded toward amplitude 959 and output as signal 936. Again, conversion of signal 936 having amplitude 959 with ADC 934 provides amplitude 956, which is again recirculated and converted to amplitude 950 and again shifted through CCD memory 932. Therefore, it can be seen how the round-off with ADC 934 and the introduction of bias VB with DAC 933 automatically compensates for degradation of the signal shifted thereby compensating for an accumulation of error such as from round-off errors, bias related errors, and shift related errors.

In still another example, output analog signal 936 may be degraded to level 951, where ADC 934 converts the analog signal 951 to digital form and "rounds high" to the next higher increment of amplitude 952. Signal amplitude 952 is then degraded through recirculation, D/A conversion and shifting as described above the amplitude level 953 (the same as amplitude 951) as output signal 936 but is again converted with ADC 934 to digital form and again "rounded-high" to amplitude 954 (the same as amplitude 952) before again recirculating.

Rounding high may be accomplished with well known analog biasing, digital biasing, adding one digital increment, or other well known rounding techniques. For example, a "non-significant" or bias bit may be set to a fixed state to bias the digital number to the high side for a "round-high" arrangement.

In view of the above, it can be seen that degradation of an analog signal such as due to shifting, can be limited to a finite error or resolution region and can be prevented from accumulating without limit. Therefore, limiting the magnitude of error accumulation permits analog signal degradation to be tolerated and permits unlimited shifting operations with only a limited error accumulation.

The above described embodiments for elimination of accumulating error has been described relative to recirculation for a hybrid memory. It should be understood that this inventive feature has broad applicability, where this inventive feature may be practiced with an embodiment that either biases an input analog signal or rounds-off an output analog signal or both, biases an input signal and rounds-off an output signal as discussed relative to FIGS. 9C and 9D above.

In the above example, biasing and round-off of signals has been shown using digital techniques. Other bias and round-off techniques may be used. For example, analog biasing such as with summing resistors or by scaling the signals may be used. Similarly, round-off may be achieved with digitizing a signal. Other arrangements will now become obvious to those skilled in the art from the teachings of the present invention.

An adaptive refresh arrangement will now be described with reference to FIG. 9F. A CCD memory 932 stores information under control of clock signal 943. The information is loaded as signal 949 and output as signal 936 in serial form. These signals may be analog level signals or digital single bit signals. Refresh circuit 996 refreshes memory output signal 936 for output and for recirculation as signal 960. The output signal from the memory system may be the unrefreshed memory signal 936 or the refreshed signal 960, shown as outputs from memory 932 by arrows pointing out of the memory system to other systems. Refreshed signal 960 may be recirculated back to the input of memory 932 under control of selection circuitry and a FET electronic switch 947.

Input signals to memory 932 are selected with input selector switches 947, 991 and 992 to generate input signal 949. Switch 947 selects recirculation signal 960 from memory output. Switch 991 selects analog input signal AI to load new information into memory 932. Switch 992 selects a reference signal REF. Switches 947, 991, and 992 may be selected with digital gates such as AND gates 987 and 988 and inverter gate 989 respectively. When decoder signal 990 is low, AND gates 987 and 988 are disabled and inverter 989 is enabled for non-selecting switches 947 and 991 and for selecting switch 992. When decoder signal 990 is high, AND gates 987 and 988 are enabled and inverter 989 is disabled for selecting either switch 947 or 991 in response to recirculation mode command signal RECIRC and input mode command signal INPUT or for non-selecting switch 992 respectively. Recirculation is enabled with recirculation command signal RECIRC to gate 987 and input signal AI is enabled with input command signal INPUT to gate 988. Therefore, memory 932 may load recirculated information, input information, or a reference signal under control of signals to gates 987, 988, and 989.

An arrangement will now be discussed for adaptively controlling refreshing of information stored in memory 932 by using a reference signal to control gain of the refresh circuitry 996. Clock pulses 943 will herein be assumed to be from a free-running clock for simplicity of discussion, where memory 932 is continually clocked to load either recirculation signal 960, analog input signal AI, or reference signal REF under control of logical signals 948, 967, and 968 from gates 987, 988, and 989; respectively. Clock signal 943 may clock a counter 993 to provide a count that is indicative of the number of clock pulses received and therefore the position of the information shifted into memory 932. For example, counter 993 provides operation similar to the bit, word, and sector counters associated with well known prior art disk memories which are used for counting disk memory clock pulses to keep track of the location of information on a rotating disk. Counter output signals 994 are provided to decoder 995 generating decoder output signal 990 in response to a particular code of counter signals 994 from counter 993. Well known decoders such as the Texas Instruments Ser. No. 7445 decoder provides a high signal output when the input code is not true and provides a low signal output when the input signal code is true. Therefore, when counter 993 increments through a selected code, decoder 995 may provide a low output signal 990; which may enable switch 992 through inverter 989 and which may disable switches 947 and 991 through gates 987 and 988 respectively to load a reference signal REF into memory 932 through switch 992 as signal 949. In one embodiment, the selected code in counter 993 lasts for one period of clock signal 943, where the next clock pulse increments counter 993 to a different code condition. Therefore, decoder output signal 990 may have a single clock pulse width and reference signal REF loaded into memory 932 may be loaded into a single bit position.

Mode selection may be performed with a mode flip-flop M1 for selecting a recirculation mode with the Q signal RECIRC or for selecting an input mode with the Q signal INPUT. The state of the mode flip-flop M1 may be controlled with well known logic arrangements such as toggling a Ser. No. 7473 J-K flip-flop or loading a mode condition into a Ser. No. 7474 D flip-flop. The recirculation mode is commanded when the M1 flip-flop generates a high recirculation mode signal RECIRC thereby enabling gate 987, where recirculation control signal 948 becomes high for the period of time that decoder signal 990 is high. Recirculation control signal 948 controls recirculation switch 947 to be conductive for the period of time decoder signal 990 is high to conduct recirculation signal 990 to the input of CCD memory 932 as signal 949. Similarly, the input mode is commanded when the M1 flip-flop generates a high input mode signal INPUT, thereby enabling gate 988, where input control signal 967 becomes high for the period of time that decoder signal 990 is high. Input control signal 967 controls input switch 991 to be conductive for the period of time decoder signal 990 is high to conduct input signal AI to the input of CCD memory 932 as signal 949. Mode command signals RECIRC and INPUT are mutually exclusive, where only one of these mode command signals may be high at a time, which is characteristic of flip-flop Q and Q output signals. Therefore, either the recirculation switch 947 will be conductive as enabled by recirculation control signal 948 being high, or the input switch 991 will be conductive as enabled by input control signal 967 being high, or neither recirculation switch 947 nor input switch 991 will be conductive when disabled by decoder signal 990 being low.

Decoder signal 990 is high for the data load portion of a memory cycle and low for a reference load portion of a memory cycle as will be discussed with reference to FIG. 9G. A memory cycle may be defined as a storage sequence of a combination of data and reference signals. In a simplified example used herein, memory cycle may be the number of clock pulses required to shift a stored signal from the input of memory 932 to the output of memory 932. For example, a memory having a 512 data bit capacity and a one reference bit capacity may have a memory cycle of 513 clock pulses. Therefore, the decoder signal 990 will be high for the 512 data bit portion of the memory cycle and will be low for the one reference bit portion of the memory cycle. When decoder signal 990 is high, inverter 989 will be disabled and gates 987 and 988 will be enabled; where data will be recirculated through switch 947 or data will be input through switch 991 under control of mode signals RECIRC or INPUT. When decoder signal 990 is low, inverter 989 will be enabled and gates 987 and 988 will be disabled independent of the state of mode signals RECIRC and INPUT. Inverter 989 will invert a low decoder signal 990 to produce a high reference control signal 968 to make reference switch 992 conductive, which results in reference signal REF being input to memory 932 as signal 949 where reference signal REF will be input through switch 992.

Reference signals can be introduced into selected bit positions of memory 932 with counter 993, decoder 995, and input circuitry 908. Reference signal REF may be a precise amplitude signal, wherein the precision of the amplitude may be preserved with a good quality electronic switch 992 or other switch which are well known in the art, wherein a precision reference amplitude signal input to CCD memory 932 through switch 992 as signal 949 may be stored in a selected bit position. The reference signal bit may be shifted through memory 932 under control of clock signal 943 and shifted out of memory 932 as output signal 936 to refresh circuitry 996. The reference signal may be degraded as it is shifted through memory 932, consistent with the charge transfer inefficiency of the CCD type memory devices. Reference signal REF stored in and shifted through memory 932 may be degraded by substantially the same amount as other signals stored in and shifted through memory 932. Because reference signal REF was initially stored in memory 932 as a precise signal amplitude, the amplitude of the reference signals when shifted out of memory 932 is indicative of the degradation through memory 932. Therefore, the reference signal output from memory 932 may be used to control the refresh circuitry to provide an adaptive control for amplitude reconstruction. Adaptive control is herein intended to mean control that is adjusted to the actual conditions, where refresh circuitry 996 operating under control of a degraded reference signal may be used to control refresh operation as a function of actual degradation of the signal and may therefore be used over a range of degradation variables such as over a temperature range, over a clock pulse frequency range, and over variations between different CCD memory devices and may further be used to adaptively compensate for other variations such as bias errors caused by charge leakage, aging of CCD memory elements, and other such effects.

In a simplified embodiment, it may be assumed that counter 993 contains a number of counts equal to the number of bits in memory 932 and that a particular count code, which may be the first count code for the present simplified example, is detected with decoder 995 to generate decoder signal 990. For the first count of each memory shifting sequence, the output of decoder 990 will go low thereby commanding loading of the reference signal REF into memory 932 as discussed above and simultaneously enabling refresh circuitry 996 with decoder signal 990 to sample or otherwise monitor a signal being shifted out of memory 932; wherein the synchronization counter 993 provides another frame, or initialization point, or start of the shift operation with a reference signal being loaded into memory 932 and the last prior reference signal being simultaneously available as the output signal 936 of memory 932. Therefore, decoder 995 may enable loading of a new reference signal into memory 932 and may also enable sampling of the degraded reference signal as signal 936 output from memory 932 with refresh circuitry 996.

In a simplified example, it will be assumed that memory 932 has a four bit storage capacity and that counter 993 is a two bit counter for a four count operation, known as a modulo-3 counter. This example will now be discussed with reference to the waveforms shown in FIG. 9G. Clock signal 943 is represented as a sequence of clock pulses. Signal 990 is shown as a square-wave signal which is low for each fourth bit time, which is consistent with decoder 995 decoding the output of a two-bit four-state counter 993. Data signal 949 is shown in digital squarewave form for convenience but may also be implemented as analog amplitude signals. Data waveform 949 is shifted into memory 932 and similarly is shifted out of memory 932 as signal 936 after a four bit time shift delay. Therefore, signals 949 and 936 are substantially the same signal except that signal 936 has been delayed four clock pulse periods and has been degraded by the shifting operations through memory 932. It will further be assumed for this example that recirculation control signal RECIRC is high and the input control signal INPUT is false. Therefore, three data bits will be recirculated during the high period of decoder signal 990 and one reference bit will be loaded during the low period of decoder signal 990. As shown in FIG. 9G, data signals (shown as a "1" and a pair of "0"s following the reference signal R) will be recirculated as signal 990 through switch 947 under control of decoder signal 990 and mode signal RECIRC. Therefore, when decoder signal 990 goes low, gate 987 will cause control signal 948 to go low thereby making switch 947 non-conductive and disabling recirculation signal 960. Further, when decoder signal 990 goes low, inverter 989 will cause control signal 968 to go high thereby enabling reference signal REF to load a precision voltage into the CCD memory, shown in FIG. 9G as signal R in waveform 949. Similarly, when decoder signal 990 goes high, recirculation signal 960 will be enabled with gate 987 and switch 947 and reference signal REF will be disabled with inverter 989 and switch 992, thereby permitting the three data bits shown as a "100" code to be recirculated as signal 960 into memory 932 as signal 949. Therefore; as counter 993 increments from a count of 0 to a count of 3, decoder 995 enables the reference signal REF to be loaded into memory 932 at the count of 0 and the digital data in memory 932 (consisting of a "100" sequence) to be recirculated and loaded into memory 932 at the counts of 1, 2, and 3. Refresh circuitry 996 monitors the reference signal shifted out of memory 932 as signal 936, identified by a low decoder output signal 990 to refresh circuitry 996; where refresh circuitry 996 will adaptively re-establish the amplitude levels of the data in response to the reference signal, as described in detail hereinafter.

A simplified embodiment of a refresh circuit will now be described with reference to FIG. 9H. Output signal 936 from memory 932 is processed with amplifier 963. Sample-and-hold circuit 961 samples the output signal 936 under control of the decoder sample signal 990; where decoder signal 990 going low enables sample-and-hold 961 to sample the reference bit of output signal 936; thereby providing output signal 962 indicative of degradation of the reference signal through memory 932. Amplifier 963 may be an RCA Model No. CA3080 trans-conductance amplifier, wherein the gain through amplifier 963 is controlled by control signal 962. Therefore, memory output signal 936 is adjusted in amplitude with amplifier 963 as a function of control signal 962, thereby providing refreshed recirculation signal 960. Control signal 962 may be connected to control input $I_{ABC}$ of amplifier 963 and signal 936 may be applied to the inverting input of amplifier 963, wherein the output signal 960 is related to the product of the signals 962 and 936. It may be desired that the amplitude of signal 960 be inversely proportional to the control signal 962, wherein control signal 962 may be implemented as a complement signal by subtraction from a reference signal or may be inverted as a reciprocal signal inversely proportional to the sample signal 963 for complement or inverse control of amplifier 963. Such subtraction may be used for compensation of bias type errors in a manner similar to that described herein for multiplication compensation of scale factor type errors. Reciprocal and subtraction circuits are well known in the art and may be introduced in signal line 962 to complement or invert the signal from sample and hold 961.

Figure 9E:
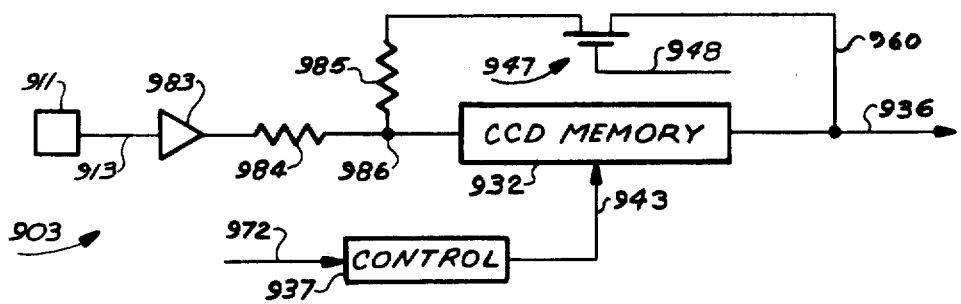
Figure 9F:
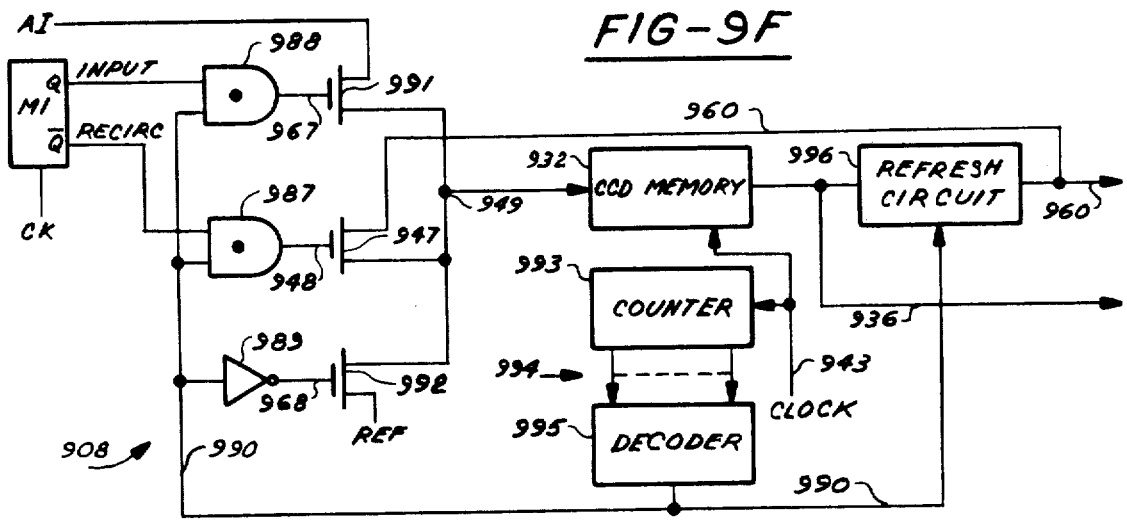
FIG. 9F illustrates an adaptive memory refresh arrangement.
Figure 9G:
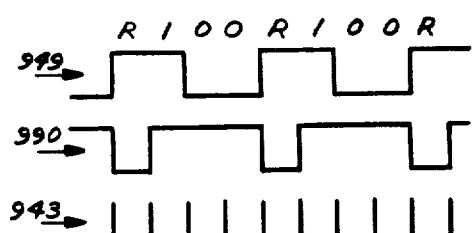
FIG. 9G illustrates the signal forms associated with the adaptive memory refresh arrangement shown in FIG. 9F.
Figure 9H:
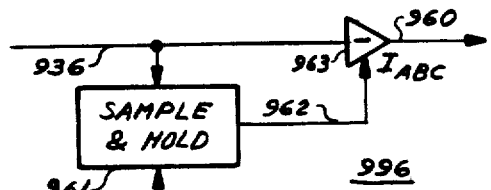
FIG. 9H shows a first refresh circuit.
Figure 9I:
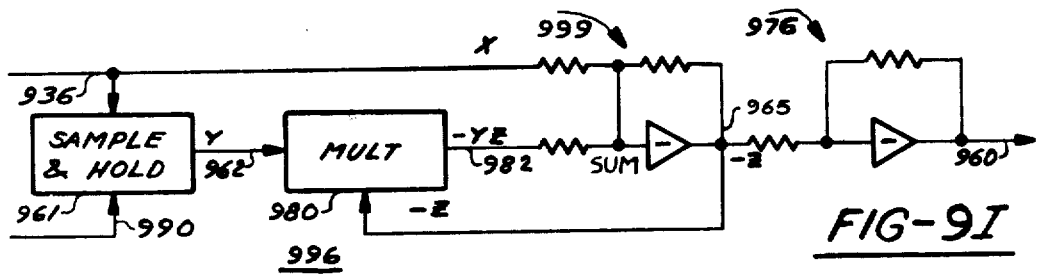
FIG. 9I shows a refresh circuitry having an analog implicit servo.

An alternate embodiment of refresh circuitry 996 is shown in FIG. 9I, where memory output signal 936 is loaded into sample-and-hold 961 under control of decoder signal 990, as described with reference to FIG. 9H, and signal 936 is further processed with an inverting circuit to provide an output amplitude that is inversely proportional to the degradation of the reference signal. An implicit servo is shown in FIG. 9I, implemented with multiplier 980 and summer 999, wherein an implicit servo is well known in the art and is described in the reference by Levine listed hereinafter. The sampled reference signal is provided as signal 962 to multiplier 980. Multiplier 980 generates a product signal 982 which is proportional to the sampled signal 962 and the memory output signal 965 ($-Z$). The product signal 962 and the input signal 936 are algebraically summed with summing amplifier 999 to provide an implicit servo output signal 965; which can be shown to be related to input signal 936 divided by sampled signal 962. Amplifiers 999 and 976 may be used to adjust the scale factor of signal 965 to the desired value with feedback and input resistors and may be used to provide amplification, buffering, and inversion of summation signal SUM. Output signal 960 can be shown to have an amplitude proportional to the amplitude of input signal 936 and inversely proportional to the degraded reference signal 962 stored in sample-and-hold circuit 961.

The implicit servo shown in FIG. 9I will now be described. The implicit servo discussion will reference Equation (3) through Equation (7) below to provide a simplified explanation of operation. Signals will be represented in Equations (3)–(7) by the reference designation of the signal as shown in FIG. 9I provided in parentheses () in the equation as being indicative of the signal magnitude.

| | |
|---|---|
| $(SUM) = (936) + (982) \approx 0$ | Equation (3) |
| $(SUM) = (936) + (962)(965) = X - YZ \approx 0$ | Equation (5) |
| $(965) = -(936)/(962)$ | Equation (6) |
| $Z = X/Y$ | Equation (7) |

Summation signal SUM is equal to the difference between product signal 982 and input signal 936. Because output signal 965 is fedback in servo form to multiplier 980 to close a servo loop, signal SUM is controlled to be a very low magnitude near zero signal, as shown by the approximately zero ($\approx 0$) symbol in Equation (3). Multiplier signal 982 from multiplier 980 is equal to the product of signal 965 and adaptive scale factor signal 962, as shown in Equation (4). Substitution of Equation (4) into Equation (3) to eliminate the signal 982 term yields Equation (5). Grouping of terms, factoring of the signal 965 term, and solving for the signal 965 yields the input signal 936 term divided by adaptive scale factor signal 962; as shown in Equation (6). This solution is based upon the assumption that signal 965 is servoed to a very low signal amplitude then amplified wih amplifier 999 to generate signal 965 for output and for feedback. In a high gain servo, the error in assuming that signal SUM is approximately equal to zero may be very small and will be assumed to be negligible. Equation (6) shows that different signal 965 is approximately equal to input signal 936 divided by the adaptive scale factor signal 962; wherein the greater the degradation through memory 932, the smaller will be adaptive scale factor signal 962 and therefore the larger will be the signal 965. In other words, the degraded signal 936 is multiplied by the reciprocal of the sampled reference signal to increase the signal 936 to a level related to the amount of degradation, as defined by adaptive scale factor signal 962. Other analog signal processing and implicit servo arrangements will now become obvious to those skilled in the art such as providing various function generation circuits to adjust the amplitude of degraded signal 936 as a function of adaptive control signal 962.

An alternate discussion of an implicit servo will now be presented with reference to the textbook by Levine listed hereinafter; wherein the following description is similar to the example provided on page 157 therein and wherein signals 936, 962, and 965 will be referred to as signals X, Y, and Z respectively for compatability with the description in the book by Levine. It is desired to solve the equation Z=X/Y as shown in Equation (7), wherein Z is the corrected output signal 965, X is the degraded memory signal 936, and Y is the adaptive control signal 962 defining the magnitude of the required re-scaling. The servo output signal (−Z) is fedback to multiplier 980 to be multiplied with adaptive scale factor signal Y 962 to provide output signal (−YZ) as signal 982. Signal 982 (−YZ) is added to the uncorrected signal X 936 at the summing junction of operational amplifier 999 to generate the summation signal SUM which is amplified with amplifier 999 to provide output signal (−Z) 965 as a solution to equation (7).

The corrected signal (−Z) 965 is processed with inverting amplifier 976 to generate a non-inverted output and recirculation signal 960. Scale factors may be readjusted by a fixed amount by selecting feedback resistors of operational amplifiers 999 and 976.

Figure 9J:
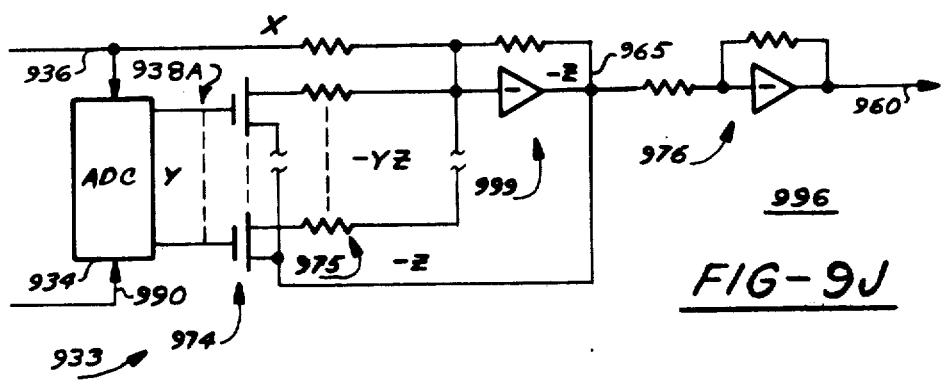
FIG. 9J shows a hybrid refresh circuit having an implicit servo.

Still another embodiment of the refresh circuit 996 is shown in FIG. 9J. Decoder signal 990 may be used to enable analog-to-digital converter (ADC) 934 to convert a reference bit of the memory output signal 936 to provide a digital output number Y 938A proportional to the degraded reference signal. Output word 938A may be used to excite multiplying digital-to-analog converter (DAC) 933. The DAC is implemented with analog switches 974 and weighted summing resistors 975 in a well known arrangement. Multiplying DAC 933 generates an output signal to the summing junction of operational amplifier 999 that is proportional to the digital number (Y) 938A and proportional to the excitation signal (−Z) 965 fedback from the output of operational amplifier 999. Similar to the mechanization discussed for FIG. 9I above, feedback signal (−Z) 965 is multiplied by digital input number (Y) 938A to generate output analog signal −YZ. Signal −YZ is summed with input signal X at the summing junction of operational amplifier 999 to generate output signal (−Z) 965 for feedback and for output. Buffer amplifier 976 is used for invention, scaling, and buffering, as discussed with reference to FIG. 9I above.

Devices shown in FIGS. 9F-9J are well known in the art. For example, counter 993 may be a Texas Instruments (TI) counter Ser. No. 7493, decoder 995 may be a TI decoder Ser. No. 7441-Ser. No. 7449, inverter 989 may be a TI inverter Ser. No. 7404 and AND gates 987 and 988 may be TI gates Ser. No. 7408. Switches 947, 991, and 992 may be any well known switches and, in a preferred embodiment, may be electronic switches implemented with field effect transistors (FETs). CCD memory 932 may be a well known CCD memory shift register device. Sample-and-hold circuit 961 is well known in the prior art, wherein one prior art sample-and-hold circuit is manufactured by Datel Systems Inc. as Model SHM-3. Analog multipliers are well known in the art and may be implemented with any well known analog multiplier such as with a RCA model CA3080 transconductancer amplifier connected as an analog multiplier. One form of analog multiplier is shown in block diagram form as multiplier 980. A RCA CA3080 transconductance amplifier form of multiplier is shown as device 963. These two forms are exemplary of the present invention which may be implemented with other well known forms of analog multipliers. Converters such as ADC 934 and multiplying DAC 934 are well known in the art, wherein commercial ADC and multiplying DAC devices are exemplified by Datel Systems Inc. devices model ADC 89 series and model DAC-HI 12B respectively. Operational amplifiers for summing and buffering operations are well known in the prior art such as the Fairchild $\mu$a709 and $\mu$a741 operational amplifiers which may be arranged with input and feedback resistors as shown with circuit 999 and 976.

The arrangements discussed with reference to the figures are presented in a simplified form to better exemplify the present invention although many other arrangements may be utilized which will now become obvious to those skilled in the prior art. For example, refresh circuitry 996 may be implemented with a well known automatic gain control (AGC) circuitry. An AGC circuit may operate from the reference signal 962 that is sampled in response to decoder signal 990 as described above. In an alternate embodiment which finds primary advantage in a digital memory arrangement, refresh circuitry 996 may integrate the signals from CCD memory 932 to provide a gain control signal related to the average of the information stored in memory 932. Information in memory 932 may include control signals to equalize the number "1" and "0" counts being loaded into memory 932 so that the integral of the output signals 936 will have an average value of 0 and will have an amplitude related to the degraded signal amplitude. Further, for a digital memory arrangement, refresh circuitry 996 may merely sample digital one bits shifted out of CCD memory 932, being indicative of signal degradation without the use of the reference signal discussed above.

In an alternate embodiment, the amplitudes of the input signals 949 to memory 932 may be adjusted in relation to the degradation through memory 932 to normalize output signals 936 in contrast to the arrangement described above wherein refresh circuitry 996 re-establishes the amplitude of output signals for input of a normalized signal to memory 932 as signal 949.

Input circuitry; consisting of logic gates 987-989 and analog switches 947, 991, and 992; may be considered to be a multiplexer because this circuitry combines or multiplexes a plurality of analog signals (particularly data signal 960 or AI with reference signal REF). Further, refresh circuitry 996 may be considered to be a demultiplexer because this circuitry separates or demultiplexes a plurality of analog signals (particularly the reference signal which is separated with sample and hold 961 from the memory output signal).

It can be seen that CCD memory 932 (FIGS. 9C, 9E and 9F) are electronic devices that may be shifted or not shifted under control of gated clock pulses 943 from control logic 937. Therefore, control of CCD memory may permit outputting of information on line 936 and inputting of information on line 949 while clocking CCD memory 932 or while holding the state of CCD memory 932 stationery by disabling clock 943. This is a significant advantage over the well known rotating memories such as disk memories, where a disk memory is continually rotating and may not be conveniently stopped due to the inertia of the memory and other such considerations. Therefore, a CCD memory that may be stopped under control of electronic signals will provide greater versatility in accessing and loading information and generally in operation of the memory device.

Although the present memory arrangement may be described with respect to a CCD memory and signal processing arrangement, it is intended that the inventive features described herein be applicable to signal processing and memory arrangements in general and not be limited to CCD arrangements. For example, an adaptive refresh arrangement described herein is equally applicable to other memory arrangements such as a magnetostrictive delay line memory and an LC delay line memory.

The CCD arrangements discussed with reference to FIGS. 9C-9J are described for embodiments wherein signals are stored in analog signal form having analog resolution. It will become obvious to those skilled in the art that these arrangements can also be used to store digital information such as in single bit form. For example, ADC 934 may be a single bit ADC such as a threshold detector. In one embodiment, a well known Schmidt trigger threshold detector may be used as a one-bit ADC 934 to detect whether the output information 936 is above or below a threshold, indicative of a binary one or a binary zero condition. If above the threshold, Schmidt trigger ADC 934 may restore the amplitude to an upper amplitude magnitude and, if below a threshold, Schmidt trigger ADC 934 may restore the signal to a lower amplitude magnitude. As described with reference to FIGS. 9C and 9D above, ADC 934 would restore the input signal 949 to an amplitude that may permit degradation through CCD memory 932 without traversing the higher level threshold, detected with ADC 934. This arrangement can be described with reference to FIG. 9D, where amplitude 956 may be defined as the high level threshold of Schmidt ADC 934, where an input signal 936 to ADC 934 above amplitude 956, such as amplitude 951, may be detected as a high level signal and may be restored to a high level recirculation amplitude 952. Shifting through CCD memory 932 would degrade amplitude 952 to amplitude level 953 which is still greater than the minimum high level amplitude 956; where ADC 934 may restore amplitude 953 to the high level recirculation amplitude 954. The system may have a characteristic where the difference between input threshold 956 and recirculation amplitude 955 is greater than the degradation of signal 949 when shifted through CCD memory 932, where this degradation may be the difference in amplitude between points 952 and 953 which is less than the difference in amplitude 955 (952) and 956. Input signals 936 to ADC 934 which are below threshold 956 may be recirculated as low level magnitudes.

Degradation of low level amplitudes may be of only secondary consideration because degradation of amplitudes through CCD memory 932 may tend to reduce the amplitude of the signal, thereby minimizing the detrimental effect on low level amplitudes. According to this consideration, it may be desirable to provide high level amplitude for a first binary state and a low level amplitude for a second binary state, where the low level amplitude may be closer to zero voltage than to a high level negative amplitude. For example, representation of two binary states with a high level positive amplitude and a low level amplitude or a high level negative amplitude and a low level amplitude are preferred over an arrangement with representation of two binary states with a high level positive amplitude and a high level negative amplitude; where degradation of high level negative signals may be comparable to degradation of high level positive signals and where degradation of low level positive or negative signals may be minimized.

Now, an example will be provided to illustrate this degradation consideration. A binary signal will be assumed representing a one state whenever the signal amplitude is greater than a threshold amplitude 956 and a zero state whenever the signal amplitude is less than a threshold amplitude 956. Threshold signal amplitude 956 is assumed to be three volts, degraded signal amplitude 951 and 953 is assumed to be four volts, restored one level signal amplitude 952 and 954 are assumed to be five volts, and restored zero level signal amplitude (not shown) is assumed to be zero volts. As restored signal 952 is shifted through CCD memory 932, the signal is shown being degraded from a five volt amplitude 952 to a four volt amplitude 953, but four volts is greater than the three volt threshold of Schmidt trigger 934. Therefore, the four volt input signal 936 will be restored to an equivalent five volt output signal 938A at amplitude 954. As a zero level signal is shifted through CCD memory 932, the signal will be reduced in amplitude toward zero volts (if it is not already at zero volts) and will, therefore, not be degraded toward the threshold amplitude 956.

In another embodiment, the threshold signal is assumed to be zero volts, the restored binary one signal is assumed to be plus three volts, the restored binary zero signal is assumed to be minus three volts, and signal degradation is assumed to be from the plus voltage level and from the minus voltage level toward the zero voltage threshold level. Therefore, both the binary one and the binary zero voltage levels will degrade toward the threshold level. Therefore, this embodiment may be less desirable than the embodiment of the above example where only the binary one voltage level will degrade toward the threshold voltage level.

In still a further embodiment of the hybrid memory arrangement of the present invention, a ternary memory may be provided with a three state ADC 934, where the recirculation line 938A from ADC 934 may have three states including a positive amplitude, a zero amplitude, or a negative amplitude. ADC 934 may be implemented with a pair of Schmidt triggers, where a positive Schmidt trigger may generate a high level amplitude or low level amplitude in response to a high level or a low level positive amplitude of input signal 936 and a negative Schmidt trigger may generate a high level amplitude or a low level amplitude in response to a high level or low negative amplitude of input signal 936. Therefore, if input signal 936 had a high level positive amplitude, the positive Schmidt trigger would be in the positive high level state and the negative Schmidt trigger would be in the low level state; if input signal 936 had a low level amplitude, both positive and negative Schmidt triggers would be in the low level state; and if input signal 936 had a negative high level amplitude, the positive Schmidt trigger would be in the low level state and the negative Schmidt trigger would be in the negative high level state. Summing of Schmidt trigger outputs would provide a high level output if the positive Schmidt trigger was in the high level state, a negative output if the negative Schmidt trigger was in the negative high level state, and low level output if both Schmidt triggers were in the low level state. It should be noted that when one of the Schmidt triggers is in a high level state, the other Schmidt trigger is in the low level state consistent with ternary signal forms and with the binary nature of Schmidt trigger threshold detectors.

CCD COMPOSITOR

Compositors are well known in the geophysical art. One well known prior art compositor is implemented in the CAFDRS system sold by United Geophysical Corporation, an affiliate of Bendix Corporation located in Pasadena, California, which is implemented with a General Automation Corp. SPC-16 computer. Another well known compositor is the trace compositor, model 1011 manufactured by Scientific Data Systems of Santa Monica, California and described in Technical Manual SDA 98 02 62A dated November 1967. Such compositors accept input waveforms from geophone transducers and store the sampled waveforms in memory, where corresponding samples of each sequential waveform are added together. The sampling and adding of input waveform samples to previously sampled and added corresponding waveform samples is known as compositing. Compositing effectively sums or integrates corresponding samples in the temporal or time domain to enhance the signal-to-noise ratio.

An improved compositor arrangement is shown in FIG. 9E using a CCD memory arrangement. CCD compositor 903 is shown for a single transducer input waveform. In a preferred embodiment, a plurality of compositor channels may be provided wherein one compositor channel per transducer may be used to composite each transducer input waveform known as a trace.

In reference to FIG. 9E, input transducer 911 generates transducer signal 913 which is preprocessed with buffer amplifier 983. Transducer signal from buffer amplifier 983 is input to CCD memory 932 through summing resistor 984. As data in CCD memory is shifted with clock pulses 943, the input signal 986 is shifted into and stored in CCD memory 932. Control signal 972 enables control 937 to generate clock pulses 943 for the period of a trace, where control signal 972 enables the shifting of CCD memory 932 at the start of an input trace from transducer 911 and control signal 972 disables the shifting of CCD memory 932 at the completion of the input trace from transducer 911. The first trace may be loaded into CCD memory 932, where the recirculation path 960 is disabled by making FET switch 947 non-conductive with control signal 948, which is indicative of the first trace to be loaded into CCD memory 932. Opening of the recirculation path 960 insures that the first trace will be loaded into CCD memory 932 and that prior contents of the CCD memory will not carry-over to the new composited information. For subsequent traces following the first trace, control signal 948 controls FET 947 to be conductive to provide a recirculation path for the composited information in CCD memory 932 to be recirculated and added to the input trace through summing resistor 985 to summing point 968, where the input trace signal will be added to summing point 986 through input summing resistor 984. Therefore, when a trace subsequent to the first trace is sensed by transducer 911, this new input trace will be summed with the recirculated composited information 960 and then shifted into CCD memory 932. Therefore, CCD memory 932 provides the operation of storing the composited information and summing resistors 984 and 985 provide the operation of adding the input information to the stored information.

The information stored in CCD memory 932 may be analog samples, wherein the shift clock 943 effectively samples a portion of input signal 913 by inputting to CCD memory on input signal line 986, then shifting under control of clock 943.

Input control signal 972 to control logic 937 may be related to the illuminating signal such as a well known chirp signal, where system 100 generates a control signal 145 to transmitter 104, which may be a well known VIBROSEIS device for illuminating an underground environment. Control signal line 972 may be derived from transmitter signal 145 to start the sampling and compositing of input signal 913 with CCD memory 932. Control 937 may include a timer such as a well known counter to provide clock pulses 943 for a fixed period of time starting with the transmitter command signal 145 input to control 937 as signal 972.

One distinction of the CCD compositor of the present invention is that the signals are added in the analog domain and are stored as analog signals in contrast to digital domain summing and storage in prior art systems. Another distinction is that a separate compositor channel may be used for each input channel rather than using the prior art time-shared adder and disk memory storage.

Additional distinctions and advantages may be obtained by using the hybrid memory teachings of the present invention discussed with reference to FIGS. 9C and 9D in conjunction with the compositor discussed with reference to FIG. 9E. In this arrangement, analog trace signals may be provided as analog input 944 to be added with recirculated signal 979 at summing point 949. Alternately, input information may be digitized with a well known ADC and may be input as signals 938C to logic 940 which may be well known adding logic to add the input information 938C to the recirculated information 938A to provide the summed digital information 938B for storage in CCD memory 932.

Another feature of the present invention provides for summing of analog signals which are input to a CCD. Such analog summing is exemplified with summing resistors 984 and 985 to summing junction 986 shown in FIG. 9E. Similarly, CCD input signals 919 (FIG. 9A) may be summed or otherwise combined but with other analog signals. Further, input signal 944 and recirculation 936 in hybrid memory arrangement 902 shown in FIG. 9C may be summed as input signal 949 if recirculation control signal 948 makes recirculation FET 947 conductive at the same time that input control signal 946 makes input FET 945 conductive. In a preferred embodiment, summing is performed with summing resistors as is well known in the art such as with summing resistors 984 and 985 to summing junction 986 as shown in FIG. 9E. For simplicity, summing resistors may not be shown such as for recirculation signal 936 and input signal 944 to summing junction 949. Still further, other analog summing arrangements are well known in the art.

In CCD compositor arrangement 903, an arrangement may be used to compensate for signal degradation, as discussed with reference to FIGS. 9C and 9D above. Further, recirculation 960 may be scaled to the proper amplitude such as with well known scaling techniques using ADC 934 or, alternately, by adjusting summing resistors 984 and 985.

REFERENCES

Acoustic imaging systems are well known in the art, where the system of the present invention provides improvements to these well known imaging systems.

One prior art arrangement is the Acoustic Imaging System being built by Bendix Electrodynamics Division in Sylmar, California for the Naval Undersea Research and Development Center in San Diego, California.

Another prior art acoustic imaging system is the Computer Augmented Field Data Recording System (CAFDRS) which has been developed and manufactured by United Geophysical of Pasadena, California. CAFDRS is used in geophysical research and exploration. These systems may be reconfigured from the teachings of the present invention to practice this invention.

Various publications may be used for providing background for this invention and for illustrating the prior art. The various subject areas and associated references for each subject area are listed below.

1. Bryant, Steven B.: "Acoustic Imaging By Computer Reconstruction" report no. NUC TN 309, Naval Undersea Research and Development Center (NUC), Pasadena, California, November 1969.
2. Keil, Tenny J.: "The Methods of Acoustic Imaging" report no. NUWC TN 161, Naval Undersea Research and Development Center (NUC), Pasadena, California, August 1968.
3. Lopes, L. A. and O. F. Thomas: "A Digital Camera for Acoustic Applications" report no. NUWC TN 219, Naval Undersea Research and Development Center (NUC), Pasadena, California, December 1968.
4. Metherell, Alexander F., et. al.: "Introduction to Acoustical Holography", *The Journal of the Acoustical Society of America*, 42:4, 1967.
5. Deschamps, Georges A.: "Some Remarks on Radio-Frequency Holography," Proceedings of the IEEE, April 1967.
6. Huang, T. S. and H. L. Kasnitz: Proceedings of the Computerized Imaging Technique Seminar, Society for Photo-Optical Instrumention Engineers, XVII-1, 1967.
7. Goodman, Joseph W.: *Introduction to Fourier Optics*, McGraw-Hill Book Company, San Francisco, California, 1968.
8. DeVelis, John B. and George O. Reynolds: *Theory and Applications of Holography*, Addison-Wesley Publishing Company, Reading, Mass.
9. Robiner, Lawrence R. and Radner, Charles M. (Editors): "Digital Signal Processing" IEEE Press, 1972.
10. Butler, D. and Harvey, G.: "The Fast Fourier Transform and its Implementation".
11. Electronic Design Magazine May 10, 1973.
12. Klauder et. al; "The Theory and Design of Chirp Radars"; *The Bell System Technical Journal;* vol. XXXIX; no. 4; July 1960.
13. Dolph, C. L.; "A Current Distribution For Broadside Arrays Which Optimizes The Relationship Between Beam Width and Side-Lobe Level"; *Proceedings of the IRE and Waves and Electrons;* June 1946.
14. Anstey, N. A.; "Correlation Techniques-A Review".
15. Levine, Leon; Methods For Solving Engineering Problems Using Analog Computers, McGraw-Hill Book Company, San Francisco, California, 1964.
16. J. E. Carnes and W. F. Kosonocky; "Charged-Coupled Devices and Applications"; Solid State Engineering magazine, April 1974, pages 67-77.
17. W. S. Boyle and G. E. Smith; "*Charge-Coupled Semiconductor Devices*"; Bell System Technical Journal; 587, (1970).
18. G. P. Amelio et al.; "Experimental Verification of the Charge Coupled Device Concept"; Bell System Technical Journal; April 1970. These publications and the publications referenced therein provide non-essential subject matter and are incorporated herein by reference.

GENERAL CONSIDERATIONS

The present invention has been described for an underwater acoustic imaging system in order to exemplify the teachings of the present invention. It is intended that the acoustic imaging system be merely exemplary of the broad scope and features of the present invention.

It is herein intended that the system of the present invention discussed for an acoustic imaging embodiment be exemplary of other such imaging systems including radar systems, laser systems, and the like. Further, this invention is directed to the broad field of processing coherent signals and processing signals having phase and amplitude relationships such as exemplified by acoustic hydrophone signals related to an acoustic interference pattern.

Terminology pertaining to illumination is herein intended to include acoustic illumination; electromagnetic illumination including radio waves, laser waves and visible illumination; and other forms of illumination. Illumination provides for illuminating or ensonifying an environment, a medium or an object and provides for generating illumination signal inputs such as reflected illumination having characteristics of the environment. For example, illumination of an undersea environment with an acoustic transmitter provides reflected input acoustic signals to a hydrophone array, wherein the input acoustic signals have an interference pattern related to the characteristics of the undersea environment such as the characteristics of the medium and the characteristics of objects located therein.

The term "medium" is herein intended to mean the transmission medium for transmission of and for propagation of the illumination signals. For example, the acoustic medium may be seawater, the radar medium may be the atmosphere or space, and the geophysical medium may be the earth.

Illumination may be generated with a transmitter such as an acoustic transmitter as discussed above or as a well known radar transmitter or laser transmitter which provide a source of illumination energy for illuminating an environment. The terms "input transducers" and other terms pertaining thereto are herein intended to mean general transducers and transducer arrays exemplified by a hydrophone array for an acoustic imaging system, a photoelectric array for a laser system, a photosensitive medium for light, a well known radio receiver array for a radar system and other known input transducer arrangements.

Terminology relating to an output device is intended to be broadly interpreted and to include operator displays such as the well known CRT display for displaying information, projection displays such as forming an image on a screen or without a screen as is well known for laser holography, photographic film for recording an image, digital recording devices such as magnetic tape devices for recording digital image information, or other output devices for receiving image information. Further, output signals may be interference pattern outputs such as analog signals 121 and digital signals 124 to provide interference pattern information to the output devices discussed above.

Terms pertaining to holography are herein intended to include signals related to coherent illumination, interference patterns, phase signals, amplitude signals, phase and amplitude signals and the like.

Components have been shown in the figures in simplified schematic form to more easily exemplify the present invention, wherein circuit design is a well known art and wherein use of such components are well known in the art. Further, many alternate circuit embodiments and component types may be used to implement the discussed embodiments. For example, switches 216 (FIG. 2A) and FETs 917 and 918 (FIG. 9A) can be implemented with well known switches including electronic switches such as FETs and bipolar transistors and even mechanical switches such as relays. Further, improved capabilities may be obtained by higher levels of integration. For example, FETs 917 and 918 may be manufactured as part of CCD 920 (FIG. 9A) to provide the combined capabilities of demodulation, filtering, and multiplexing with monolithic circuits.

The system of the present invention is intended to have a broad scope wherein the acoustic signal processing system is intended to exemplify a generalized signal processing arrangement; CCDs are intended to exemplify generalized arrangements for storing analog signals, processing analog signals and/or transferring analog signals; FFT and correlator processors are intended to exemplify generalized digital filtering or processing arrangements; and other such devices are intended to exemplify generalized arrangements.

The term interference pattern and terms related thereto are intended to mean spatial variations in phase and/or amplitude of a signal which may represent a characteristic of the transmission medium such as due to an object in the medium.

An array and a sub-array are herein intended to mean a plurality of transducers that are spatially distributed such as for receiving signals that have spatial variations.

The term signal is herein intended to include electrical signals, acoustic signals, illumination signals, and other known signals which may be sensed such as with a transducer and which may be processed such as with a filter.

Resolution is the fineness of the data. When resolution is relatively better it is characterized as being higher, finer or greater and when resolution is relatively worse it is characterized as being lower, coarser, or poorer.

Gating of clock signals and generation of control signals is well known in the art, where preferred embodiments are set forth in copending patent applications. For example, the digital tachometer arrangement shown in FIG. 6 of said copending application Control Apparatus Ser. No. 135,040 shows a clock gating arrangement wherein gate 94 generates clock pulses at output 89 starting when input signal 18 makes a positive transition and continuing until counter 98 generates an output signal 100 to disable generation of clock pulses at gate output 89. This arrangement may be used to control the compositor shifting starting at the beginning of a trace, defined with input signal 18, and ending at the completion of a trace time period, defined with counter 98, when counter output signal 99 goes high; thereby disabling clock pulses 89 with signal 100 to gate 94. Further, copending application Control System And Method Ser. No. 134,958 sets forth a control signal and clock gating arrangement that is described therein with reference to FIG. 3B. The patents copending herewith are incorporated herein by reference as if fully set forth at length herein.

From the above description it will be apparent that there is thus provided a device of the character described possessing the particular features of advantage before enumerated as desireable, but which obviously is susceptible to modification in it's form, method, mechanization, operation, detailed construction and arrangement of parts without departing from the principles involved or sacrificing any of its advantages.

While in order to comply with the statute, the invention has been described in language more or less specific as to structural features, it is to be understood that the invention is not limited to the specific features shown, but that the means, method, and construction herein disclosed comprise the preferred form of several modes of putting the invention into effect, and the invention is, therefore, claimed in any of its forms or modifications within the legitimate and valid scope of the appended claims.

What I claim is:

1. An analog memory system comprising:
   data input means for generating an analog input data signal;
   reference input means for generating an analog input reference signal;
   means for generating an analog memory input signal in response to the analog input data signal and the analog input reference signal;
   memory storing means for storing the analog memory input signal;
   memory output means for generating an analog memory output signal in response to the analog signal stored in said memory storing means, said output means including data output means for generating an analog output data signal in response to the analog memory output signal and reference output means for generating an analog output reference signal in response to the analog memory output signal; and
   means for processing the analog output data signal in response to the analog output reference signal.

2. The system as set forth in claim 1 above further comprising hybrid memory means for storing digital information in analog signal form.

3. The processing means as set forth in claim 1 above including an implicit servo for processing the output data signal in response to the output reference signal.

4. The processing means as set forth in claim 1 above further comprising a multiplying digital to analog converter for processing the output data signal in response to the output reference signal.

5. The system as set forth in claim 1 above, wherein said storing means includes a charge coupled device for storing a plurality of analog charge signals and shifting means for shifting the stored analog charge signals in response to a sequence of control signals, wherein said system further comprises clock pulse means for generating the sequence of control signals, wherein said analog memory input signal generating means includes means for generating the analog memory input signal having one of a plurality of signal states, and wherein said analog output data signal processing means includes subtraction means for reducing effect of charge leakage.

6. A memory system for storing electrical signals, said memory system comprising:
- memory means for storing a plurality of analog signals as stored electrical analog signals;
- shifting means for shifting the stored electrical analog signals;
- analog data refresh means including means for generation an analog reference signal; and
- analog-to-digital converter means for generating digital output signals in response to the stored electrical analog signals.

7. The system as set forth in claim 6 above further comprising means for generating analog input signals to said memory means in response to the digital output signals, said memory means including means for storing the plurality of analog signals in response to the analog input signals.

8. The system as set forth in claim 6 above, wherein said memory means includes charge memory means for storing the analog signals as multiple state electrical analog charge signals having an information content related to the state of the signal.

9. The system as set forth in claim 6 above further comprising an servo for generating an analog output signal in response to the stored analog signals.

10. The system as set forth in claim 6, above further comprising a multiplying digital to analog converter for generating an analog output signal in response to the stored analog signals.

11. A memory system comprising:
- memory means for storing information, said memory means including
  - (a) means for storing the information as a plurality of analog signals and
  - (b) means for shifting the stored analog signals, wherein the shifting of the stored analog signals degrades the stored analog signals and
- means for refreshing the degraded analog signals in response to one of the stored analog signals degraded by the shifting including means for generating an analog reference signal.

12. A memory system comprising:
- memory means for storing information, said memory means including storing means for storing a plurality of analog signals and shifting means for shifting the stored analog signals, wherein the shifting of the stored analog signals degrades the stored analog signals;
- means for refreshing the degraded analog signals including means for generating an analog reference signal; and
- means for generating digital output signals in response to the refreshed analog signals.

13. A memory system comprising:
- reference input means for generating an analog reference signal:
- information input means for generating an analog information signal;
- analog input means for generating an analog input signal in response to the analog reference signal and the analog information signal; and
- memory means for storing information, said memory means including
  - (a) means for storing the information as a plurality of analog signals and
  - (b) means for shifting the stored analog signals, wherein the shifting of the stored analog signals degrades the stored analog signals; and
- means for refreshing the degraded analog signals.

14. A memory system comprising:
- memory means for storing information, said memory means including
  - (a) storing means for storing a plurality of analog signals and
  - (b) shifting means for shifting the stored analog signals, wherein the shifting of the stored analog signals degrades the stored analog signals and
- means for refreshing the degraded analog signals wherein said refreshing means includes
  - (a) reference output means for generating an analog reference output signal in response to a stored reference signal and
  - (b) information output means for refreshing the degraded analog signals in response to the reference output signal.

15. The reference output means as set forth in claim 14 above including a sample and hold circuit for storing the analog reference output signal.

16. A memory system comprising:
- data input means for generating a digital input signal; digital to analog converter means for generating an analog input signal in response to the digital input signal;
- reference input means for generating a reference input signal;
- means for generating a memory input signal in response to the analog input signal and the reference input signal;
- memory means for storing the memory input signal;
- output means for generating a memory output signal in response to the signal stored in said memory means, said output means including
  - (a) data output means for generating an output data signal in response to the memory output signal and
  - (b) reference output means for generating an output reference signal in response to the memory output signal; and
- means for processing the output data signal in response to the output reference signal.

17. The system as set forth in claim 16 above further comprising digital to analog converter means for generating a digital output signal in response to the output data signal.

18. The system as set forth in claim 17 above wherein said digital input signal generating means includes select means for selecting the digital output signal as the digital input signal.

19. A memory system comprising:
- information input means for generating an analog information signal;
- reference input means for generating an analog reference signal;
- storing means for storing the analog information signal generated by said information input means and the analog reference signal generated by said reference input means; and refreshing means for generating a refreshed analog information signal in response to the stored analog information signal and the stored analog reference signal.

20. The system as set forth in claim 19 above, wherein said information input means includes:
- digital input means for generating a digital information signal and converter means for generating the analog information signal in response to the digital information signal.

21. The system as set forth in claim 19 above further comprising means for generating a comparison signal in response to the stored analog reference signal and the stored analog information signal.

22. The system as set forth in claim 19 above further comprising reference output means for generating a reference output signal in response to the stored analog reference signal; wherein said refreshing means includes means for reducing degradation of the stored analog information signal in response to the stored analog reference signal.

23. The system as set forth in claim 12 above, wherein said memory means includes charge storing means for storing the analog signals as multiple state charge signals having an information content related to the state of the multiple charge signals and wherein said refreshing means includes means for reducing amplitude degradation of the degraded analog signals.

24. The system as set forth in claim 12 above further comprising:
information input means for generating an analog information signal;
reference input means for generating an analog reference signal; and
multiplexing means for generating an analog combination signal in response to the analog input signal and the analog reference signal; wherein said storing means is responsive to the analog combination signal for storing the plurality of analog signals.

25. The system as set forth in claim 14 above wherein said information output means includes means for increasing amplitude of the degraded analog signals in response to the reference output signal.

26. The system as set forth in claim 14, above further comprising:
information input means for generating a digital input signal and
means for generating a multiple state analog input signal having an information content related to the state of the analog input signal in response to the digital input signal;
wherein said storing means is responsive to the multiple state analog input signal for storing the stored analog signals as multiple state analog signals.

27. The system as set forth in claim 14 above further comprising:
data input means for generating a data input signal and
reference input means for generating a reference input signal;
wherein said storing means includes means for storing the plurality of analog signals in response to the data input signal and the reference input signal.

28. The system as set forth in claim 14 above wherein said system provides for storing digital information in analog signal form, said system further comprising means for generating digital input information and means for generating the stored analog signals in response to the digital input information.

29. The system as set forth in claim 16 above further comprising recirculation means for generating the memory input signal in response to the memory output signal.

30. The system as set forth in claim 16 above further comprising digital output means for generating a digital output signal in response to the memory output signal.

31. A hybrid memory system for storing digital information in analog signal form, said system comprising;
memory means for storing a plurality of electrical analog signals;
shifting means for shifting the stored electrical analog signals;
converter means for generating electrical digital output signals in response to the stored analog signals;
means for storing a reference signal; and
means for processing the stored analog signals in response to the stored reference signal.

32. A hybrid memory system for storing digital information in analog signal form, said system comprising:
memory means for storing a plurality of electrical analog signals;
shifting means for shifting the stored electrical analog signals;
converter means for generating electrical digital signals in response to the stored analog signals;
means for storing a reference signal in said memory means and
means for refreshing the stored analog signals in response to the stored reference signal.

33. A hybrid memory system for storing digital information in analog signal form, said system comprising:
memory means for storing a plurality of electrical analog signals;
shifting means for shifting the stored electrical analog signals;
converter means for generating electrical digital signals in response to the stored analog signals;
means for generating an analog input signal in response to the digital information;
means for generating an analog reference input signal; and
means for generating the plurality of analog signals to be stored in said memory means in response to the analog input signal and the analog reference input signal.

34. A hybrid memory system storing digital information in analog signal form, said system comprising:
memory means for storing a plurality of electrical analog signals;
shifting means for shifting the stored electrical analog signals;
converter means for generating electrical digital signals in response to the stored analog signals; and
means for storing a reference signal and means for refreshing the stored analog signals in response to the stored reference signal.

35. A memory system comprising:
input means for (selecting one of a plurality of) generating digital input signals
means for generating electrical analog signals in response to the digital input signals;
memory means for storing a plurality of the electrical analog signals,
means for shifting the stored electrical analog signals;
converter means for generating digital output signals in response to the stored electrical analog signals;
means for storing a reference signal and
means for processing the stored analog signals in response to the stored reference signal.

36. A hybrid memory system for storing analog information in response to digital input information, said system comprising:
   memory means for storing information, said memory means including
   (a) means for storing a plurality of analog signals
   (b) means for shifting the stored analog signals, wherein the shifting of the stored analog signals degrades the stored analog signals;
   means for refreshing the degraded analog signals;
   means for storing a reference signal, wherein said refreshing means includes means for refreshing the degraded analog signals in response to the stored referece signal.

37. The system as set forth in claim 14 above, wherein said memory means includes a charge transfer device for storing the analog signals in charge signal form.

38. The system as set forth in claim 16 above, wherein said memory means includes charge storage means for storing the memory input signal as a multiple state electrical charge signal having an information content related to the state of the multiple level electrical charge signal and wherein said processing means includes a differential circuit for reducing charge leakage degradation of the output data signal in response to subtraction of the output reference signal.

39. The system as set forth in claim 11 above; wherein said memory means includes magnetostrictive means for storing the information in magnetostrictive signal form, wherein said storing means includes means for storing the analog signals as multiple state signals having an information content related to the signal state, and wherein said refreshing means includes scale factor means for reducing amplitude degradation of the stored analog signals and differential means for reducing leakage degradation of the stored analog signals.

40. The system as set forth in claim 13 above, wherein said memory means includes a magnetostrictive memory for storing the information in magnetostrictive signal form, wherein said storing means includes means for storing the plurality of analog signals as multiple state analog signal having an information content related to the state of the stored signal, and wherein said refreshing means includes scale factor means for reducing amplitude degradation of the degraded analog signals and differential means for reducing leakage degradation of the degraded analog signals.

* * * * *